(12) United States Patent
Geisler et al.

(10) Patent No.: US 8,970,274 B2
(45) Date of Patent: Mar. 3, 2015

(54) PULSE LATCHES

(75) Inventors: Joseph Patrick Geisler, Austin, TX (US); Kin Hooi Dia, Hsinchu (TW)

(73) Assignee: MediaTek Singapore Pte. Ltd., Singapore (SG)

(*) Notice: Subject to any disclaimer, the term of this patent is extended or adjusted under 35 U.S.C. 154(b) by 47 days.

(21) Appl. No.: 13/491,622

(22) Filed: Jun. 8, 2012

(65) Prior Publication Data

US 2013/0328601 A1 Dec. 12, 2013

(51) Int. Cl.
H03H 11/16 (2006.01)
(52) U.S. Cl.
USPC .......................... 327/239; 327/299
(58) Field of Classification Search
CPC .............. G06F 13/4009; G06F 13/404; G06F 17/5059; G06F 17/3864; H04F 1/0043; H04L 1/0052; H04L 1/0041; H04L 1/0042; H04L 1/0045
USPC ............................ 327/239, 295, 299; 710/106
See application file for complete search history.

(56) References Cited

U.S. PATENT DOCUMENTS

| | | | | |
|---|---|---|---|---|
| 3,909,633 A * | 9/1975 | Hall, II | ........................ | 327/166 |
| 5,130,568 A * | 7/1992 | Miller et al. | .................... | 327/202 |
| 5,175,447 A * | 12/1992 | Kawasaki et al. | ............. | 327/211 |
| 5,719,878 A * | 2/1998 | Yu et al. | ........................ | 714/726 |
| 5,926,050 A * | 7/1999 | Proebsting | ..................... | 327/170 |
| 6,025,738 A * | 2/2000 | Masleid | ........................... | 326/83 |
| 6,147,513 A * | 11/2000 | Bui | .................................. | 326/83 |
| 6,181,179 B1 * | 1/2001 | Kanba | ............................ | 327/202 |
| 6,433,603 B1 * | 8/2002 | Singh et al. | ..................... | 327/211 |
| 6,560,147 B2 * | 5/2003 | Yoshiyama | ............... | 365/189.05 |
| 6,911,845 B2 * | 6/2005 | Hossain et al. | .................. | 326/93 |
| 7,320,098 B2 * | 1/2008 | Shin | ............................... | 714/726 |
| 7,358,786 B2 * | 4/2008 | Kim | ................................ | 327/202 |
| 7,411,413 B2 * | 8/2008 | Shimazaki et al. | ............. | 326/16 |
| 7,816,964 B2 * | 10/2010 | Kim | ................................. | 327/218 |
| 7,873,896 B2 * | 1/2011 | Huang et al. | ................... | 714/769 |
| 7,952,390 B2 * | 5/2011 | Takatori et al. | .................. | 326/93 |
| 8,106,698 B2 * | 1/2012 | Kim | ................................. | 327/208 |
| 8,289,060 B2 * | 10/2012 | Tower et al. | .................... | 327/218 |
| 8,386,858 B2 * | 2/2013 | Lee et al. | ....................... | 714/718 |
| 8,456,214 B2 * | 6/2013 | Frederick, Jr. | ................. | 327/208 |
| 8,531,208 B2 * | 9/2013 | Jung et al. | ......................... | 326/46 |
| 8,631,291 B2 * | 1/2014 | Kim | ................................. | 714/731 |
| 8,724,410 B2 * | 5/2014 | Matsui et al. | .................. | 365/201 |

* cited by examiner

*Primary Examiner* — Thomas J Hiltunen
(74) *Attorney, Agent, or Firm* — Winston Hsu; Scott Margo

(57) ABSTRACT

A pulse latch includes a pulse generator and a latch circuit. The pulse generator generates first and second pulse signals. The first pulse signal is generated when a test enable signal is in a first state, and the second pulse signal is generated when the test enable signal is in a second state. The latch circuit outputs the latched signal by selectively latching a normal data input signal or a test data input signal. The latch circuit includes first and second tri-state elements. The first tri-state element is controlled by the first pulse signal to enable the test data input signal to be latched when the test enable signal is in the first state. The second tri-state element is controlled by the second pulse signal to enable the normal data input signal to be latched when the test enable signal is in the second state.

30 Claims, 12 Drawing Sheets

PULSE LATCHES

BACKGROUND

The present disclosure relates generally to electronics, and more specifically to pulse latches.

Latches or flip-flops can latch input data and output latched data. They are often used as registers in integrated circuits, such as microcontrollers. There are many types of latches, such as simple set-reset (SR) latches, gated set-reset latches, gated D latches, clock edge-triggered D flip-flops, master-slave pulse-triggered D flip-flops, T flip-flops, and JK flip-flops. A latch or flip-flop having a scan function can receive a test signal for testing a logic circuit.

In some implementations, an integrated circuit using latches or flip-flops having the scan function can operate in a normal mode and a test mode. In the test mode, a scan test pattern is loaded through the latches or flip-flops to test the logic circuits in the integrated circuit. Multiplexers are used to multiplex data input signals and test input signals so that data input signals are provided to the latches or flip-flops during the normal mode and test input signals are provided to the latches or flip-flops during the test mode.

SUMMARY

In one aspect, in general, an apparatus includes a pulse generator and a latch circuit. The pulse generator generates a first pulse signal and a second pulse signal based on a clock signal and a test enable signal. The first pulse signal is generated when the test enable signal is in a first state, and the second pulse signal is generated when the test enable signal is in a second state. The latch circuit selectively latches a normal data input signal or a test data input signal, and outputs the latched signal. The latch circuit includes a first tri-state element and a second tri-state element. The first tri-state element is controlled by the first pulse signal to enable the test data input signal to be latched when the test enable signal is in the first state. The second tri-state element is controlled by the second pulse signal to enable the normal data input signal to be latched when the test enable signal is in the second state.

Implementations of the apparatus may include one or more of the following features. A data path from an input node of the data latch that receives the normal data input signal to an output node that provides the latched signal can have no more than two levels of logic gates. Each of the first and second pulse signals can have a pulse width that is less than one-half of a clock period. The pulse generator can include a delay circuit having delay components connected in series, each of the first and second delay components includes a transistor of a first type and a transistor of a second type, the first type of transistor of the first delay component has a channel width that is larger than the channel width of the first type of transistor of the second delay component, and the second type of transistor of the second delay component has a channel width that is larger than the channel width of the second type of transistor of the first delay component. Each delay element can include an inverter, the first type of transistor can include a PMOS transistor, and the second type of transistor can include an NMOS transistor. The delay circuit can include a third delay component connected in series after the second delay component, the third delay component can include a transistor of a first type and a transistor of a second type, the first type of transistor of the third delay component can have a channel width that is larger than the channel width of the first type of transistor of the second delay component, and the channel width of the second type of transistor of the second delay component can be larger than the channel width of the second type of transistor of the third delay component.

The pulse generator and the data latch can be configured such that a ratio between a pulse width of the second pulse signal and a data-to-output (D-to-Q) delay is within a specified range when a power supply voltage is within a predetermined rage. The pulse generator and the data latch can be configured such that a ratio between a pulse width of the second pulse signal and a data-to-output (D-to-Q) delay is within a specified range when an operating temperature is within a predetermined range. The pulse generator and the data latch can be configured such that a ratio between a pulse width of the second pulse signal and a data-to-output (D-to-Q) delay is within a specified range when a minimum dimension of a semiconductor process used to fabricate the pulse generator and the data latch is within a predetermined range. The pulse generator can include a delay circuit having series connected inverters, in which some of the inverters can have PMOS transistors having stronger driving capabilities than corresponding NMOS transistors, and some of the inverters can have NMOS transistors having stronger driving capabilities than corresponding PMOS transistors. The delay circuit can include an odd number of series connected inverters, in which some of the odd numbered inverters can have PMOS transistors having stronger driving capabilities than corresponding NMOS transistors, and some of the even numbered inverters can have NMOS transistors having stronger driving capabilities than corresponding PMOS transistors. The pulse generator can include a delay circuit having series connected inverters, in which some of the inverters can have PMOS transistors having larger capacitances than corresponding NMOS transistors, and some of the inverters can have NMOS transistors having larger capacitances than corresponding PMOS transistors. The delay circuit can include an odd number of series connected inverters, in which some of the odd numbered inverters can have PMOS transistors having larger capacitances than corresponding NMOS transistors, and some of the even numbered inverters can have NMOS transistors having larger capacitances than corresponding PMOS transistors.

The pulse generator can include a delay circuit having a first inverter and a second inverter connected in series, in which each of the first and second inverters can include a transistor of a first type and a transistor of a second type. The first type of transistor of the first inverter can have a channel width that is larger than the channel width of the second type of transistor of the first inverter, and the second type of transistor of the second inverter can have a channel width that is larger than the channel width of the first type of transistor of the second inverter. The pulse generator can include a delay circuit having a first inverter and a second inverter connected in series, in which each of the first and second inverters can have a PMOS transistor and an NMOS transistor. The dimensions of the transistors can be configured such that a first ratio $(W_{p1}/L_{p1})/(W_{n1}/L_{n1})$ is larger than a second ratio $(W_{p2}/L_{p2})/(W_{n2}/L_{n2})$, in which $W_{p1}$ and $L_{p1}$ are the channel width and channel length, respectively, of the PMOS transistor in the first inverter, $W_{n1}$ and $L_{n1}$ are the channel width and channel length, respectively, of the NMOS transistor in the first inverter, $W_{p2}$ and $L_{p2}$ are the channel width and channel length, respectively, of the PMOS transistor in the second inverter, and $W_{n2}$ and $L_{n2}$ are the channel width and channel length, respectively, of the NMOS transistor in the second inverter. The delay circuit can include a third inverter connected in series after the second inverter, in which the third inverter can have a PMOS transistor and an NMOS transistor. The dimensions of the transistors can be configured such that a third ratio (Wp3/Lp3)/(Wn3/Ln3) is larger than the second ratio (Wp2/Lp2)/(Wn2/Ln2), in which Wp3 and Lp3 are the channel width and channel length, respectively, of the PMOS transistor in the third inverter, and Wn3 and Ln3 are the channel width and channel length, respectively, of the NMOS transistor in the third inverter.

The pulse generator can be configured to generate the first and second pulse signals such that the first pulse signal has a pulse width that is different from the pulse width of the second pulse signal. The first pulse signal can have a longer pulse width compared to that of the second pulse signal. The apparatus can include a logic circuit to allow an asynchronous set or reset control signal to asynchronously set or reset, respectively, the latched signal. The pulse generator can receive a control signal having a first state and a second state, in which the control signal in the first state can enable the first and second pulse signals to be generated by the pulse generator, and the control signal in the second state can prevent the first and second pulse signals to be generated by the pulse generator. The apparatus can include logic gates to allow synchronous set or reset control signals to synchronously set or reset, respectively, the latched signal. The apparatus can include a feedback circuit connected to the output of the latch circuit, in which the feedback circuit maintains a state of the latched signal until the output of one of the tri-state elements changes state. The feedback circuit can receive a set or reset control signal, in which the set control signal causes the latched signal to have a first state, and the reset control signal causes the latched output to have a second state. The apparatus can include a delay circuit that receives the test input signal and generates a delayed test input signal that is sent to the latch circuit, in which the delay circuit reduces a hold time for the test input signal. The delay circuit can include a first inverter and a second inverter connected in series, in which each of the first and second inverters includes a transistor of a first type and a transistor of a second type, the first type of transistor of the first inverter has a channel width that is larger than the channel width of the first type of transistor of the second inverter, and the second type of transistor of the second inverter has a channel width that is larger than the channel width of the second type of transistor of the first inverter. At least one of the first and second tri-state elements includes a tri-state inverter. At least one of the first and second tri-state elements includes an inverter and a transmission gate. The apparatus can include a data processor that processes the latched signal. The apparatus can include control circuitry that is configured according to the latched signal. The latch circuit can include a second output to provide an inverted version of the latched signal. The pulse generator can be triggered by a positive edge of the clock signal to generate the first and second pulse signals. The first pulse signal and the second pulse signal are not generated in the same clock cycle.

In another aspect, in general, an apparatus includes a pulse generator and a latch circuit. The pulse generator generates a first pulse signal and a second pulse signal based on a clock signal and an enable signal. The latch circuit selectively latches one of a first input signal and a second input signal, and outputs the latched signal. The latch circuit includes a first tri-state element and a second tri-state element, in which the first tri-state element is controlled by the first pulse signal to enable the first input signal to be latched when the enable signal is at a first state, and the second tri-state element is controlled by the second pulse signal to enable the second input signal to be latched when the enable signal is at a second state.

Implementations of the apparatus may include one or more of the following features. A data path from an input node of the data latch that receives the first input data to an output node that provides the output latched data can have no more than two levels of logic gates. The pulse generator can include a delay circuit having first inverter and a second inverter connected in series, in which the first inverter can have a PMOS transistor having a channel width that is larger than the channel width of a PMOS transistor of the second inverter, and the second inverter can have an NMOS transistor having a channel width that is larger than the channel width of an NMOS transistor of the first inverter. The delay circuit can include a third inverter connected in series after the second inverter, in which the third inverter can have a PMOS transistor having a channel width that is larger than the channel width of the PMOS transistor of the second inverter, and the channel width of the NMOS transistor of the second inverter can be larger than the channel width of an NMOS transistor of the third inverter.

The pulse generator and the data latch can be configured such that a ratio between a pulse width of the first pulse signal and a delay from receiving the first data signal to outputting the latched signal is within a specified range when a power supply voltage is within a predetermined range. The pulse generator and the data latch can be configured such that a ratio between a pulse width of the first pulse signal and a delay from receiving the first input signal to outputting the latched signal is within a specified range when an operating temperature is within a predetermined range. The pulse generator and the data latch can be configured such that a ratio between a pulse width of the first pulse signal and a delay from receiving the first input signal to outputting the latched signal is within a specified range when a minimum dimension of a semiconductor process used to fabricate the pulse generator and the data latch is within a predetermined range.

The pulse generator can include a delay circuit having series connected inverters, in which some of the inverters can have PMOS transistors having stronger driving capabilities than corresponding NMOS transistors, and some of the inverters can have NMOS transistors having stronger driving capabilities than corresponding PMOS transistors. The delay circuit can include an odd number of series connected inverters, in which some of the odd numbered inverters have PMOS transistors can have stronger driving capabilities than corresponding NMOS transistors, and some of the even numbered inverters can have NMOS transistors having stronger driving capabilities than corresponding PMOS transistors. The pulse generator can include a delay circuit having series connected inverters, in which some of the inverters can have PMOS transistors having larger capacitances than corresponding NMOS transistors, and some of the inverters can have NMOS transistors having larger capacitances than corresponding PMOS transistors. The delay circuit can include an odd number of series connected inverters, in which some of the odd numbered inverters can have PMOS transistors having larger capacitances than corresponding NMOS transistors, and some of the even numbered inverters can have NMOS transistors having larger capacitances than corresponding PMOS transistors. The pulse generator can include a delay circuit having a first inverter and a second inverter connected in series, in which the first inverter can have a PMOS transistor having a channel width that is larger than the channel width of an NMOS transistor of the first inverter, and the second inverter can have an NMOS transistor having a channel width that is larger than the channel width of a PMOS transistor of the second inverter.

The pulse generator can include a delay circuit having a first inverter and a second inverter connected in series, in which each of the first and second inverters can have a PMOS transistor and an NMOS transistor. The dimensions of the PMOS and NMOS transistors can be configured such that a first ratio $(Wp1/Lp1)/(Wn1/Ln1)$ is larger than a second ratio $(Wp2/Lp2)/(Wn2/Ln2)$, in which $Wp1$ and $Lp1$ are the channel width and channel length, respectively, of the PMOS transistor in the first inverter, $Wn1$ and $Ln1$ are the channel width and channel length, respectively, of the NMOS transistor in the first inverter, $Wp2$ and $Lp2$ are the channel width and channel length, respectively, of the PMOS transistor in the second inverter, and $Wn2$ and $Ln2$ are the channel width and channel length, respectively, of the NMOS transistor in the second inverter. The delay circuit can include a third inverter connected in series after the second inverter, in which the third inverter can have a PMOS transistor and an NMOS transistor. The dimensions of the PMOS and NMOS transistors of the third inverter can be configured such that a third ratio $(Wp3/Lp3)/(Wn3/Ln3)$ is larger than the second ratio $(Wp2/Lp2)/(Wn2/Ln2)$, in which $Wp3$ and $Lp3$ are the channel width and channel length, respectively, of the PMOS transistor in the third inverter, and $Wn3$ and $Ln3$ are the channel width and channel length, respectively, of the NMOS transistor in the third inverter.

The pulse generator can be configured to generate the first and second pulse signals such that the first pulse signal has a first pulse width that is different from the pulse width of the second pulse signal. The pulse generator can include a strong device for driving the first pulse signal and a weak device for driving the second pulse signal. The apparatus can include a logic circuit to allow an asynchronous set or reset control signal to asynchronously set or reset, respectively, the latched signal. The pulse generator can receive a control signal having a first state and a second state, in which the control signal in the first state enables the first and second pulse signals to be generated, and the control signal in the second state prevents the first and second pulse signals to be generated. The apparatus can include logic gates to allow synchronous set or reset control signals to synchronously set or reset, respectively, the latched signal.

The apparatus can include a feedback circuit connected to the output of the data latch, in which the feedback circuit maintains a state of the latched signal until the output of one of the tri-state elements changes state. The feedback circuit can receive a set or reset control signal, in which the set control signal causes the latched signal to have a first state, and the reset control signal causes the latched signal to have a second state. The first input signal can include a test input signal and the second input signal can include a data input signal. The apparatus can include a delay circuit that receives the test input signal and generates delayed test input signal that is sent to the latch circuit, in which the delay circuit reduces a hold time for the test input signal. The delay circuit can include a first inverter and a second inverter connected in series, in which the first inverter can have a PMOS transistor having a channel width that is larger than the channel width of a PMOS transistor of the second inverter, and the second inverter can have an NMOS transistor having a channel width that is larger than the channel width of an NMOS transistor of the first inverter. The apparatus can include a data processor that processes the latched signal. The apparatus can include control circuitry that is configured according to the latched signal.

In another aspect, in general, a pulse latch includes a pulse generator and a latch circuit. The pulse generator generate a pulse signal based on a clock signal, in which the pulse generator includes a delay circuit having series connected delay elements, each of the delay elements including a transistor of a first type and a transistor of a second type. For some of the delay elements, the first type of transistors have stronger driving capabilities than the corresponding second type of transistors, and for some of the delay elements, the second type of transistors have stronger driving capabilities than the corresponding first type of transistors. The latch circuit latches an input signal and outputs the latched signal, in which the latch circuit includes a tri-state element that is controlled by the pulse signal.

In another aspect, in general, an apparatus that includes a pulse latch is provided. The pulse latch includes a pulse generator to generate a pulse signal based on a clock signal, in which the pulse generator receives a control signal having a first state and a second state. The control signal in the first state enables the pulse signal to be generated by the pulse generator, and the control signal in the second state prevents the pulse signal to be generated by the pulse generator. The latch circuit latches an input signal and outputs the latched signal, in which the latch circuit includes a tri-state element that is controlled by the pulse signal, and a feedback circuit connected to the output of the latch circuit. The feedback circuit receives a set or reset signal that is asserted along with the control signal, in which when the set or reset signal is in a first state and the control signal is in the first state, the feedback circuit drives the latched signal to track changes in the input signal, and when the set or reset signal is in a second state and the control signal is in the second state, the feedback circuit sets or resets the latched signal.

In another aspect, in general, an apparatus includes a pulse generator and a latch circuit. The pulse generator generates a first pulse signal and a second pulse signal based on a clock signal, in which the first pulse signal has a pulse width that is different from the pulse width of the second pulse signal. The latch circuit selectively latches one of a first input signal and a second input signal, and outputs the latched signal, in which the latch circuit latches the first input signal when the pulse generator generates the first pulse signal, and latches the second input signal when the pulse generator generates the second pulse signal.

Implementations of the apparatus may include one or more of the following features. The first input signal can include a data input signal and the second input signal can include a test input signal. The pulse width of the second pulse signal can be larger than the pulse width of the first pulse signal. The pulse generator can include a strong device for driving the first pulse signal and a weak device for driving the second pulse signal.

In another aspect, in general, a method for generating a latched signal is provided. The method includes generating a first pulse signal and a second pulse signal based on a clock signal and a test enable signal, in which the first pulse signal is generated when the test enable signal is in a first state, and the second pulse signal is generated when the test enable signal is in a second state; selectively latching one of a normal data input signal and a test data input signal, including using a first tri-state element that is controlled by the first pulse signal to enable the test data input signal to be latched when the test enable signal is in the first state, and using a second tri-state element that is controlled by the second pulse signal to enable the normal data input signal to be latched when the test enable signal is in the second state; and outputting the latched signal.

Implementations of the method may include one or more of the following features. The method can include maintaining a ratio between a pulse width of the second pulse signal and a data-to-output (D-to-Q) delay to be within a specified range when a power supply voltage is within a predetermined rage. The method can include maintaining a ratio between a pulse width of the second pulse signal and a data-to-output (D-to-Q) delay to be within a specified range when an operating temperature is within a predetermined range. The method can include maintaining a ratio between a pulse width of the second pulse signal and a data-to-output (D-to-Q) delay to be within a specified range when a minimum dimension of a semiconductor process used to fabricate the pulse generator and the data latch is within a predetermined range. The first pulse signal can have a pulse width that is different from the pulse width of the second pulse signal. The first pulse signal can have a longer pulse width compared to that of the second pulse signal.

In another aspect, in general, a method for generating a latched signal is provided. The method includes generating a first pulse signal and a second pulse signal based on a clock signal and an enable signal; and selectively latching one of a first input signal and a second input signal, including using a first tri-state element that is controlled by the first pulse signal to enable the first input signal to be latched when the enable signal is at a first state, and using a second tri-state element that is controlled by the second pulse signal to enable the second input signal to be latched when the enable signal is at a second state; and outputting the latched signal.

Implementations of the method may include the following feature. The first pulse signal can have a pulse width that is different from the pulse width of the second pulse signal.

In another aspect, in general, a method for generating a latched signal is provided. The method includes generating a first pulse signal and a second pulse signal based on a clock signal, the first pulse signal having a pulse width that is different from the pulse width of the second pulse signal; selectively latching one of a first input signal and a second input signal, in which the first input signal is latched when the pulse generator generates the first pulse signal, and the second input signal is latched when the pulse generator generates the second pulse signal; and outputting the latched signal.

Implementations of the method may include one or more of the following features. The first input signal can include a data input signal and the second input signal can include a test input signal. The pulse width of the second pulse signal can be larger than the pulse width of the first pulse signal.

DETAILED DESCRIPTION

Figure 1:
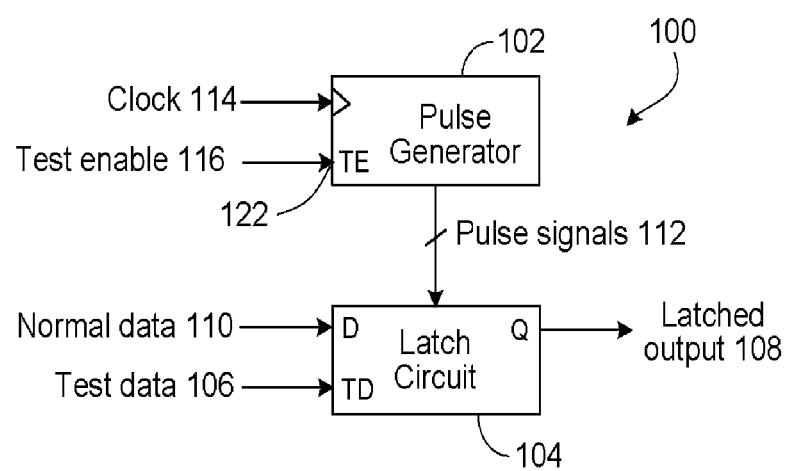
FIG. 1 is a block diagram of an example pulse latch.

Referring to FIG. 1, in some implementations, a pulse latch 100 having test functionality includes a pulse generator 102 and a latch circuit 104. The pulse latch 100 can operate in a test mode and a normal mode. In the test mode, the pulse latch 100 latches a test data input signal 106 and outputs the latched test signal as a latched output signal Q 108. In the normal mode, the pulse latch 100 latches a normal data input signal 110 and outputs the latched data signal as the latched output signal Q 108. The latch circuit 104 includes tri-state elements that are controlled by pulse signals 112 provided by the pulse generator 102. The tri-state elements determine which of the test data input signal 106 and normal data input signal 110 is latched and provided as the latched output signal Q 108. This design enables the latch circuit 104 to have a low data-to-output (D-to-Q) delay, allowing the pulse latch 100 to operate at high data rates.

A feature of the pulse latch 100 is that a multiplexer is not used to multiplex the test data input signal 106 and the normal data input signal 110 in order to select one of the signals. Rather, the pulse signals 112 are designed to control the tri-state elements in the latch circuit 104 to enable selection between the test data input signal 106 and normal data input signal 110. By removing the multiplexer, there are fewer logic gates in the path from input to output of the latch circuit 104, allowing the D-to-Q delay to be reduced.

In this description, the terms "test data" and "normal data" refer to the data received by the pulse latch 100 during the test mode and the normal mode, respectively. The content of the test data and normal data can be any type of data. For example, the normal data can include data used for performing tests by another circuit when operating the pulse latch 100 in the normal mode. The latch circuit 100 can be used in applications where there are data at two input nodes that need to be latched depending on the operating mode.

The pulse generator 102 generates two or more pulse signals for controlling the tri-state elements in the latch circuit 104. In some implementations, the pulse signals are triggered by the rising edges of a clock signal 114. The pulse generator 102 generates a first pulse signal when a test enable signal 116 is at a logic HIGH level, and the first pulse signal is used to control a first tri-state element to allow the test data input signal 106 to be latched. The pulse generator 102 generates a second pulse signal when the test enable signal 116 is at a logic LOW level, and the second pulse signal is used to control a second tri-state element to allow the normal data input signal 110 to be latched. By using two different pulse signals to control two tri-state elements, the tri-state elements can be used to select between the test data input signal 106 and the normal data input signal 110, eliminating the need for a separate multiplexer.

In some implementations, the pulse generator 102 generates a first pair of complementary pulse signals when a test enable signal 116 is at a logic HIGH level, and the first pair of pulse signals are used to control a first tri-state element to allow the test data input signal 106 to be latched. The pulse generator 102 generates a second pair of complementary pulse signals when the test enable signal 116 is at a logic LOW level, and the second pair of pulse signals are used to control a second tri-state element to allow the normal data input signal 110 to be latched. By using two different pairs of pulse signals to control two tri-state elements, the tri-state elements can be used to select between the test data input signal 106 and the normal data input signal 110, eliminating the need for a separate multiplexer.

In some implementations, the pulse latch 102 can operate at different clock frequencies for the test mode and the normal mode. For example, the pulse latch 102 can operate at a higher data rate when in the normal mode, and operate at a lower data rate when in the test mode. The pulse generator 102 can generate pulse signals with different pulse widths for driving the tri-state inverters depending on whether in the test mode or the normal mode. For example, the pulse generator 102 can generate pulse signals having shorter pulse widths when in the normal mode (in which clock periods are shorter and the hold time can be shorter), and generate pulse signals having longer pulse widths when in the test mode (in which clock periods are longer and the hold time needs to be longer).

Figure 2:
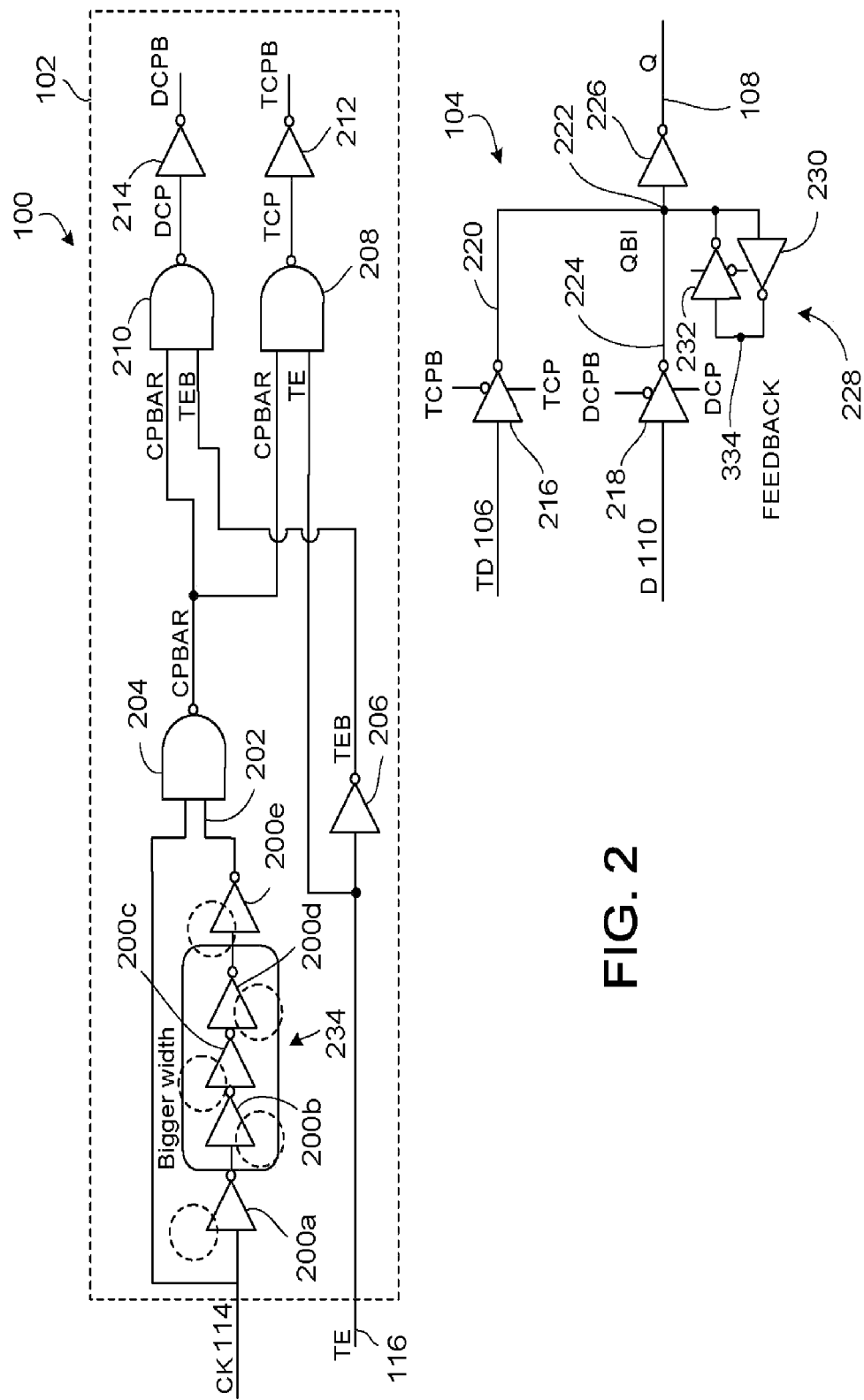
FIG. 2 is a circuit diagram of an example pulse latch.

Referring to FIG. 2, in some implementations, the pulse generator 102 receives the clock signal 114 and generates latch enable pulse signals, e.g., DCP, DCPB, TCP, and TCPB pulse signals. The clock signal 114 passes a delay circuit 234 that includes a series of delay elements, such as inverters 200a, 200b, 200c, 200d, and 200e, generating a delayed clock signal 202. The clock signal 114 and the delayed clock signal 202 are sent to a NAND gate 204, which outputs a CPBAR signal. The test enable signal 116 is sent to an inverter 206, which outputs a TEB signal. The CPBAR and TE signals are sent to a NAND gate 208, which outputs the TCP pulse signal. The CPBAR and TEB signals are sent to a NAND gate 210, which outputs the DCP pulse signal. The TCP pulse signal is sent to an inverter 212, which generates the TCPB pulse signal. The DCP pulse signal is sent to an inverter 214, which generates the DCPB pulse signal. The DCP and DCPB pulse signals are complementary of each other. The TCP and TCPB pulse signals are complementary of each other.

The TCP and TCPB pulse signals are used to control a tri-state inverter 216. For example, when the TCP pulse is HIGH and the TCPB pulse is LOW, the latch circuit 104 is "open" to the test data 106, and the tri-state inverter 216 generates an inverted version of the test data input signal 106 at an output 220 connected to a QBI node 222. When the TCP pulse is LOW and the TCPB pulse is HIGH, the output 220 of the tri-state inverter 216 is in a high impedance state.

The DCP and DCPB pulse signals are used to control a tri-state inverter 218. When the DCP pulse is HIGH and the DCPB pulse is LOW, the latch circuit 104 is "open" to the normal data 110, the tri-state inverter 218 generates an inverted version of the normal data 110 at an output 224, which is sent to the QBI node 222. When the DCP pulse is LOW and the DCPB pulse is HIGH, the output 224 of the tri-state inverter 218 is in a high impedance state. The signal at the QBI node 222 is sent to an inverter 226, which generates a latched output Q that has the same polarity as the test data input signal 106 or the normal data input signal 110. A feedback module 228 that includes an inverter 230 and a tri-state inverter 232 maintains the signal level at the QBI node 222.

When the test enable signal 116 is HIGH, the TCP pulse signal is an inverted version of the CPBAR signal, while the DCP and DCPB signals are not valid. When the test enable signal 116 is LOW, the DCP pulse signal is an inverted version of the CPBAR signal, while the TCP and TCPB signals are not valid. Thus, when the test enable signal 116 is HIGH, the output of the tri-state inverter 218 is at a high impedance state, the output 220 of the tri-state inverter 216 is an inverted version of the test data input signal 106, and the output Q is a latched version of the test data input signal 106. When the test enable signal 116 is LOW, the output of the tri-state inverter 216 is at a high impedance state, the output 224 of the tri-state inverter 218 is an inverted version of the normal data 110, and the output Q is a latched version of the normal data 110.

In some examples, the transistors used to drive the QBI node 222 in the normal mode is made larger so that the QBI node 222 can be switched quickly, while the transistors used to drive the QBI node 222 in the test mode is made smaller to reduce the capacitance on the node. Because the QBI node 222 switches slower in the test mode, it may be necessary to have a longer hold time in the test mode. Therefore, the TCP and TCPB pulses may be wider than the DCP and DCPB pulses.

Figure 3:
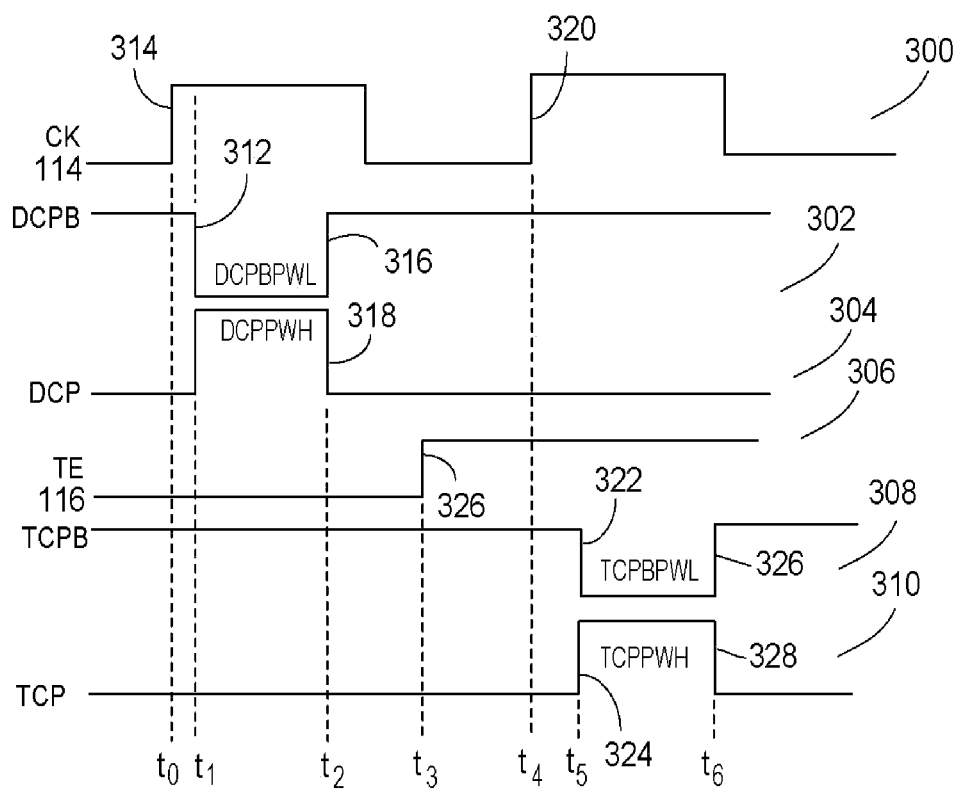
FIGS. 3 and 4 show timing diagrams.

FIG. 3 shows timing diagrams 300, 302, 304, 306, 308, and 310 for the clock signal 114, the DCPB signal, the DCP signal, the test enable signal 116, the TCPB signal, and the TCP signal, respectively. In this example, at time t0, the test enable signal 116 is LOW, enabling the latch circuit 104 to latch the normal data 110. The clock signal 114 switches from LOW to HIGH (314) at time t0. The DCPB signal switches from HIGH to LOW (312) at time t1, slightly after time t0. The pulse width DCPBPWL (DCPB pulse width low) of the DCPB signal is determined by the amount of delay provided by the inverters 200a to 200e. The longer the delay provided by the inverters 200a to 200e, the longer the low level pulse width DCPBPWL. The DCP pulse is an inverted version of the DCPB pulse (the two signals are complementary of each other). The pulse width DCPPWH (DCP pulse width high) of the DCP signal is the same as the pulse width DCPBPWL of the DCPB signal. At time t2, the DCPB signal changes from LOW to HIGH (316), while the DCP signal changes from HIGH to LOW (318). The level of the normal data in the time period for which the DCP pulse signal is HIGH will be latched by the latch circuit 104.

At time t3, the test enable signal 116 changes from LOW to HIGH (326), enabling the latch circuit 104 to latch the test data input signal 106. Assume that the first rising edge 320 of the clock signal 114 after t3 occurs at time t4. The TCPB signal switches from HIGH to LOW (322) at time t5, slightly after time t4. The pulse width TCPBPWL (TCPB pulse width low) of the TCPB signal is determined by the amount of delay provided by the inverters 200a to 200e. The longer the delay provided by the inverters 200a to 200e, the longer the low level pulse width TCPBPWL. The TCP pulse is an inverted version of the TCPB pulse (the two signals are complementary of each other). The pulse width TCPPWH (TCP pulse width high) of the TCP signal is the same as the pulse width TCPBPWL of the TCPB signal. At time t6, the TCPB signal changes from LOW to HIGH (326), while the TCP signal changes from HIGH to LOW (328). The level of the test data in the time period for which the TCP pulse signal is HIGH will be latched by the latch circuit 104.

Figure 4:
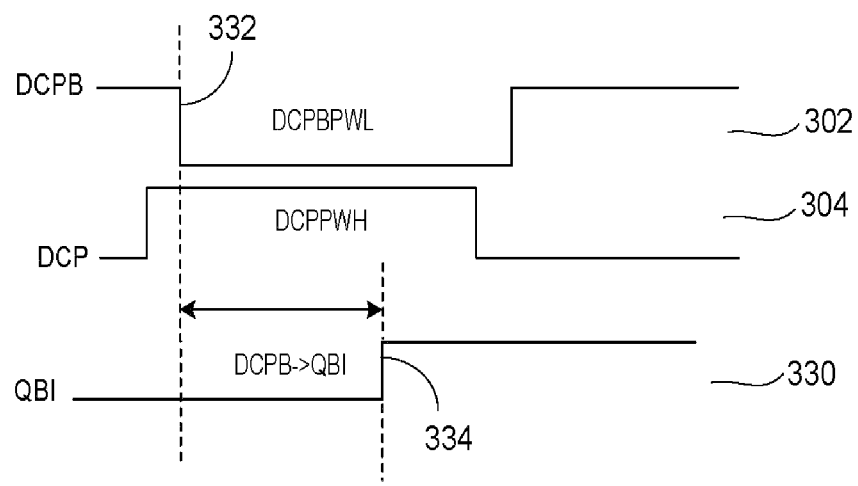

FIG. 4 shows timing diagrams 302, 304, and 330 for the DCPB signal, the DCP signal, and the signal at the QBI node 222 (referred to as the QBI signal). When designing the pulse latch, it is useful to select the device parameters such that the pulse width (DCPPWH or DCPBPWL) of the latch enable signal tracks a latch delay over a range of process, voltage, and temperature. For example, the pulse latch 100 can be designed such that the pulse width to latch delay ratio remains within a specified range over a predetermined temperature range, such as from −40° C. to 125° C. Similarly, the pulse latch 100 can be designed such that the pulse width to latch delay ratio is within a specified range over a predetermined process range (e.g., the channel length is within a predetermined range), or a predetermined power supply voltage range. This way, when the process, voltage, and/or temperature varies within the predetermined range(s), the pulse width to delay ratio remains relatively stable and does not vary by more than the specified percentage. In some examples, the latch delay can be measured from the DCPB pulse front edge 332 to the voltage level of the QBI node crossing the power supply voltage level $V_{DD}/2$ (332). In some examples, the latch delay can be measured from the DCPB pulse front edge 330 to the voltage level of the feedback node 334 (see FIG. 2) crossing the voltage level $V_{DD}/2$.

Figure 5:
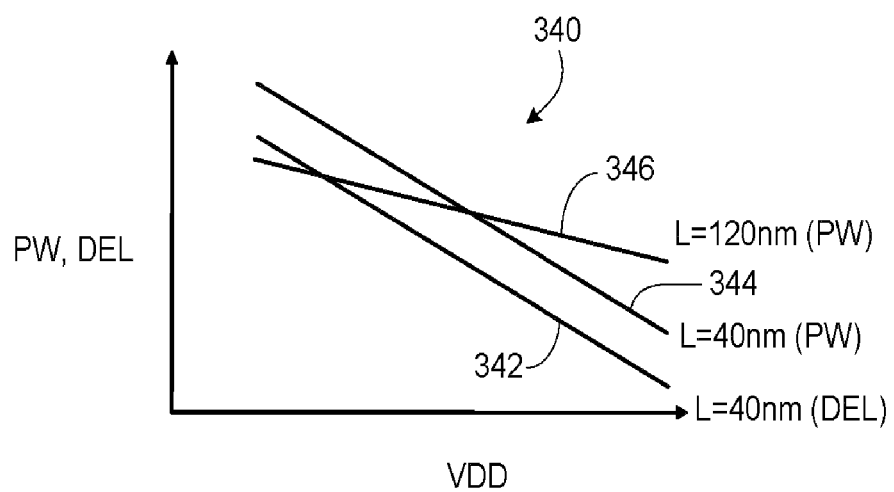
FIG. 5 is a graph.

FIG. 5 is a graph 340 having a curve 342 representing a relationship between power supply voltage $V_{DD}$ and the latch delay when the transistor channel length is 40 nm, a curve 344 representing a relationship between power supply voltage $V_{DD}$ and the pulse width (e.g., DCPPWH or TCPPWH) when the transistor channel length is 40 nm, and a curve 346 representing a relationship between power supply voltage $V_{DD}$ and the pulse width when the transistor channel length is 120 nm.

The curves 340 and 342 indicate that when the channel length is 40 nm, the changes in pulse width track the changes in delay as the power supply voltage $V_{DD}$ varies better than when the channel length is 120 nm. As shown in the figure, when the channel length is 40 nm, the pulse width is greater than the latch delay for the entire range of power supply voltage VDD being measured. By comparison, when the channel length is 120 nm, the latch delay is greater than the pulse width when the power supply voltage is lower, and the pulse width is greater than the latch delay when the power supply voltage is higher. Long channel devices (e.g., channel length=120 nm) may be useful for keeping a stable pulse. Short channel devices (e.g., channel length=40 nm) may provide a wider pulse at low voltage. In order to have the pulse width to track delay over process, voltage, and temperature ranges, it is useful to use medium length channel devices that is between the minimum channel length and five times the minimum channel length. In the example above, the channel length can be greater than 40 nm and less than 120 nm, such as 70 nm. The channel length is selected to provide stability and maintain the pulse width to delay ratio within a specified range for a range of process, voltage, and temperature values.

Figure 6:
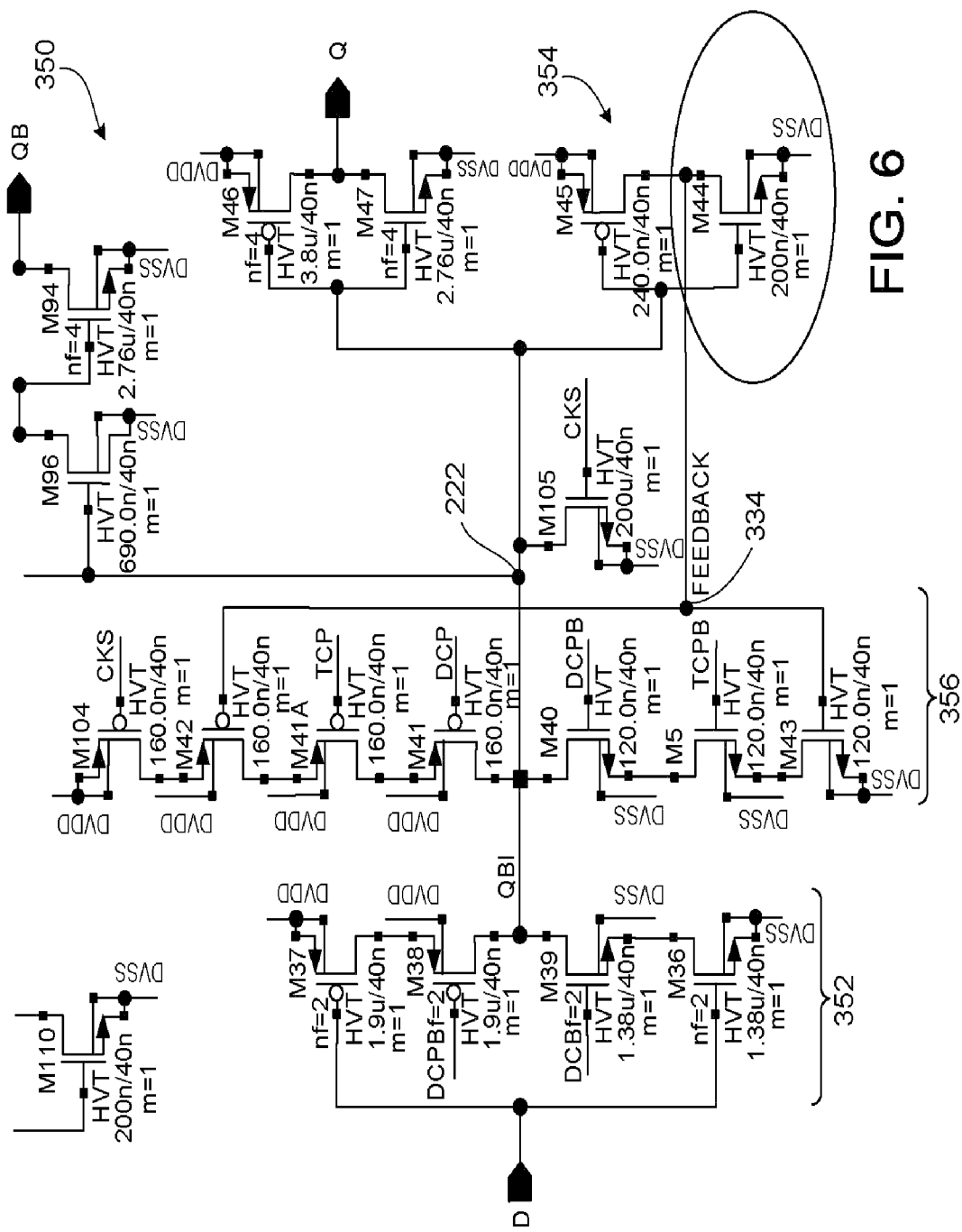
FIG. 6 is a circuit diagram of an example pulse latch.

In some implementations, the latch circuit 104 in FIG. 2 can be implemented using a latch circuit 350 shown in FIG. 6. The tri-state inverter 218 (FIG. 2) can be implemented using a tri-state inverter 352 that includes PMOS transistors M37 and M38, and NMOS transistors M39 and M36 that are connected in series. The gate nodes of the PMOS transistor M37 and the NMOS transistors M36 receive the normal data 110. The gate node of the PMOS transistors M38 receives the pulse signal DCPB, and the gate node of the NMOS transistors M39 receives the pulse signal DCP. The source node of the PMOS transistor M37 is connected to the positive power supply $V_{DD}$, and the source node of the NMOS transistor M36 is connected to ground or the negative power supply $V_{SS}$.

The feedback circuit 228 of FIG. 2 can be implemented using the inverter 354 and the tri-state inverter 356 of FIG. 6. The inverter 354 includes a PMOS transistor M45 and an NMOS transistor M44 that are connected in series. The source node of the PMOS transistor M45 is connected to the positive power supply $V_{DD}$, and the source node of the NMOS transistor M44 is connected to ground or the negative power supply $V_{SS}$. The drain nodes of the PMOS transistor M45 and the NMOS transistor M44 are connected to the feedback node 334. The gate nodes of the PMOS transistor M45 and the NMOS transistor M44 are connected to the QBI node 222.

The tri-state inverter 356 includes PMOS transistors M104, M42, M41A, and M41, and NMOS transistors M40, M5, and M43 that are connected in series. The source node of the PMOS transistor M104 is connected to the positive power supply $V_{DD}$, and the source node of the NMOS transistor M43 is connected to ground or the negative power supply $V_{SS}$. The gate node of the PMOS transistor M104 receives a CKS signal (which is used for the reset function), the gate node of the PMOS transistor M41A receives the pulse signal TCP, the gate node of the PMOS transistor M41 receives the pulse signal DCP, the gate node of the NMOS transistor M40 receives the pulse signal DCPB, and the gate node of the NMOS transistor M5 receives the pulse signal TCPB. The drain nodes of the PMOS transistor M41 and the NMOS transistor M40 are connected to the QBI node 222. The gate nodes of the PMOS transistor M42 and the NMOS transistor M43 are connected to the feedback node 334.

The latch circuit 350 includes another tri-state inverter (not shown), similar to the tri-state inverter 352, that is activated when latching the test data.

Figure 7:
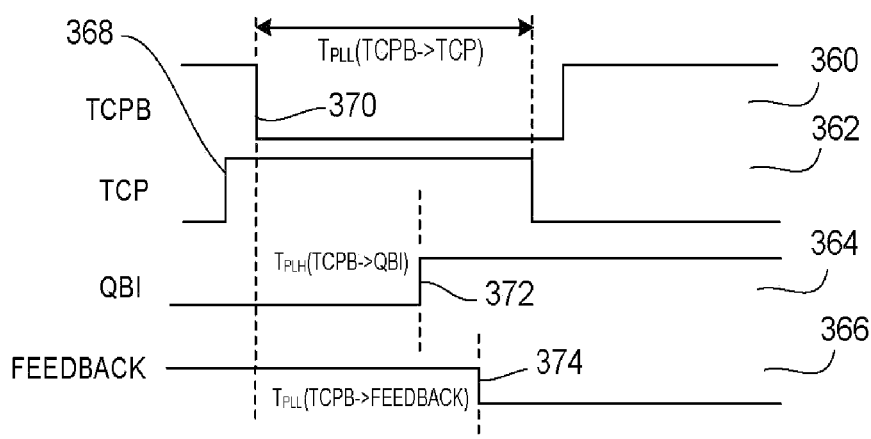
FIG. 7 shows timing diagrams.

FIG. 7 shows timing diagrams 360, 362, 364, and 366 of the TCPB, TCP, QBI, and feedback signals, respectively. When the TCP signal switches from LOW to HIGH (368), the TCPB signal switches from HIGH to LOW (370). The normal data is blocked by the tri-state inverter 352. Assuming that the test data signal is at a LOW level, a tri-state inverter (216 in FIG. 2) causes the QBI node 222 to switch from LOW to HIGH (372), and the feedback circuit 354 causes the feedback signal to switch from HIGH to LOW (374).

In the example of FIG. 6, the feedback signal is gated by the DCP and TCP signals, meaning that as long as the DCP or TCP pulse is HIGH, the QBI node is not affected by the feedback signal. In some examples, a pulse signal CP=NOR (TCP, DCP) can be used to control the tri-state element such that only when both TCP and DCP are LOW will the feedback signal affect the QBI node. Using an additional pulse signal CP may require more verification to prevent misalignment of pulses.

In the example of FIG. 6, the feedback signal, the TCP signal, and the DCP signals are provided to series connected PMOS transistors M42, M41A, and M41, respectively. This way, the feedback signal will affect the QBI node only when both the TCP and DCP signals are LOW. The transistors for receiving the TCP and TCPB pulse signals are located on the outside, the transistors for receiving the DCP and DCPB pulse signals are located at the middle, and the transistors for receiving the FEEDBACK signal is the closest. This will give the test data to QBI node path more time to switch. The TCP or DCP falling edge turns on the feedback inverter.

In some implementations, the pulse generator 102 may have a programmable delay circuit such that the pulse widths of the TCP and DCP pulse signals are programmable. In some implementations, a multiplexer is used to generate two different pulse widths for the TCP and DCP pulse signals.

Figure 8:
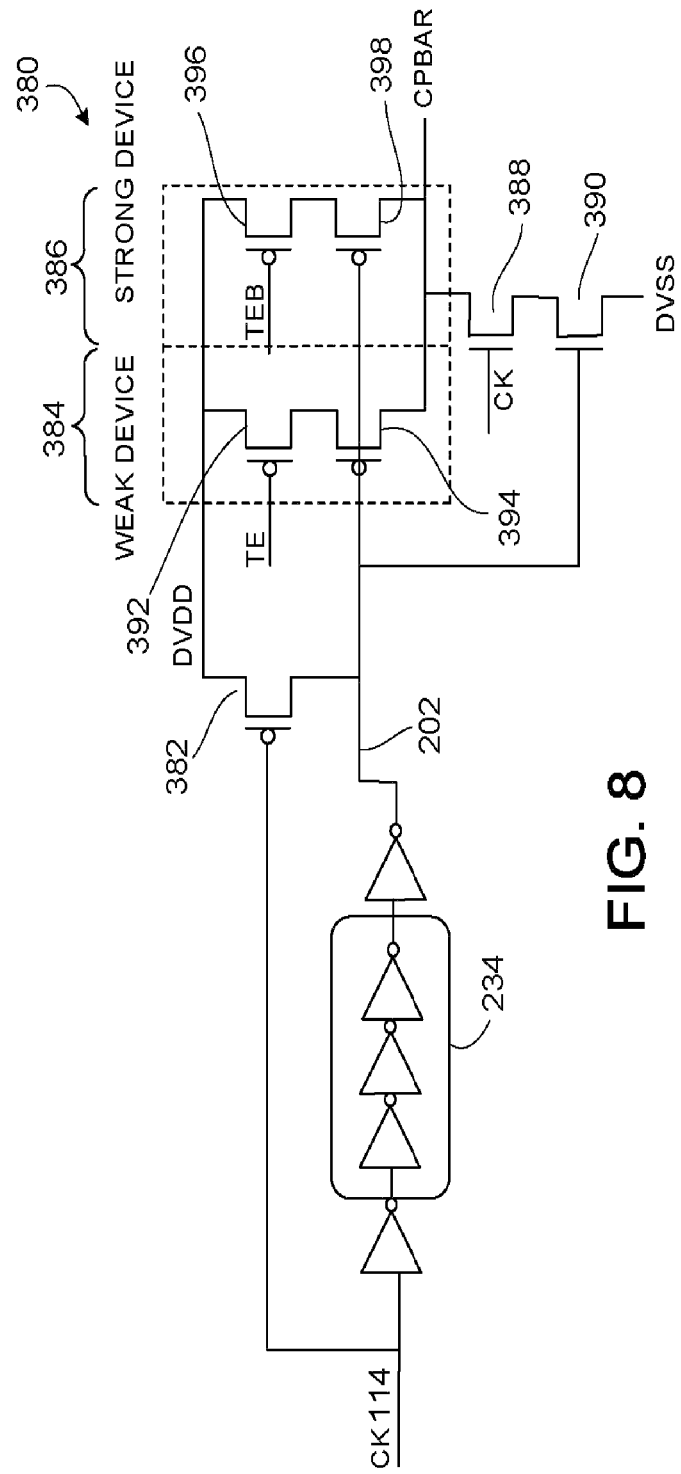
FIG. 8 is a circuit diagram of an example pulse signal generator.

Referring to FIG. 8, in some examples, the pulse generator 102 can be implemented using a circuit 380 that includes a delay circuit 234, a PMOS transistor 382, a weak device 384, a strong device 386, an NMOS transistor 388, and an NMOS transistor 390. The delay circuit 234 receives a clock signal 114 and generates a delayed clock signal 202. The weak device 384 includes a PMOS transistor 392 and a PMOS transistor 394 that are connected in series. The gate node of the PMOS transistor 392 receives the TE pulse signal, and the gate node of the PMOS transistor 394 receives the delay clock signal 202. The strong device 386 includes a PMOS transistor 396 and a PMOS transistor 398 that are connected in series. The gate node of the PMOS transistor 396 receives the TEB pulse signal, and the gate node of the PMOS transistor 398 receives the delay clock signal 202. The strong device 386 uses transistors having larger channel width/channel length ratios so that the transistors can pull up or down signal levels faster, as compared to the weak device 384.

The gate node of the NMOS transistor 388 receives the clock signal 114, and the gate node of the NMOS transistor 390 receives the delayed clock signal 202. The output of the weak device 384 and the strong device 386 is a CPBAR signal, which is sent to NAND devices 208 and 210 and inverters 212 and 214 (FIG. 2) to generate the TCP, DCP, TCPB, and DCPB pulse signals.

When the TEB pulse signal is LOW and the TE pulse signal is HIGH, the weak device 384 is turned off, and the strong device 386 is enabled to drive the CPBAR signal. When the TE pulse signal is LOW and the TEB pulse signal is HIGH, the strong device 386 is turned off, and the weak device 384 is enabled to drive the CPBAR signal. Because the strong device 386 drives the CPBAR signal faster (compared to the weak device 384), the TCP pulse width is longer than the DCP pulse width. This is useful because the clock is slower in the test mode, and having a longer TCP pulse may enable the test data to be properly latched.

In some implementations, the pulse latch 100 can have asynchronous set and/or reset functionality by asynchronously inhibiting the pulse generator 102, and asynchronously setting or resetting the feedback circuit.

Figure 9:
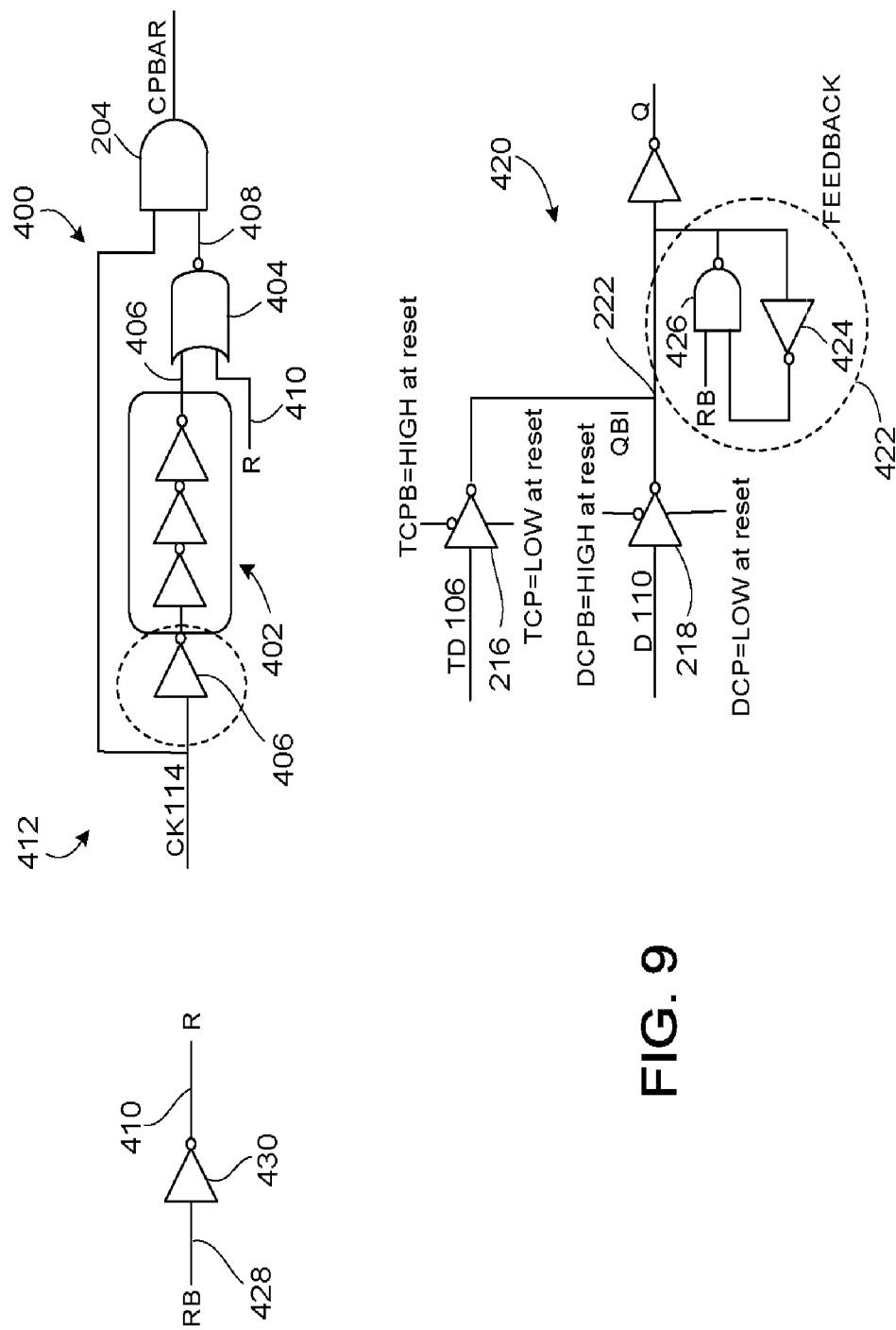
FIG. 9 is a circuit diagram of an example pulse latch having reset functionality.

Referring to FIG. 9, in some examples, a pulse latch 412 having asynchronous reset functionality includes a pulse generator 400 and a latch circuit 420. The pulse generator 400 includes a delay circuit 402 having an even number of delay elements 406 (e.g., inverters), a NOR gate 404, and an NAND gate 204. The delay circuit 402 receives a clock signal 114 and generates a delayed clock signal 406 having the same polarity as the clock signal 114. A reset bar (RB) signal 428 is provided to an inverter 430 to generate a reset (R) signal 410. The reset signal 410 and the delayed clock signal 406 are provided to the inputs of the NOR gate 404. The output 408 of the NOR gate 404 and the clock signal 114 are provided to the inputs of the NAND gate 204, which outputs a CPBAR signal.

When the reset signal 410 is LOW, the output 408 of the NOR gate 404 is an inverted version of the delayed clock signal 406. When the reset signal 410 is HIGH, the output 408 of the NOR gate 404 switches to LOW, and the CPBAR signal switches to switches to HIGH, regardless of the clock signal level. This inhibits the generation of the pulse signals. An "enable" pin can be added to the front of the delay circuit 402 to realize the enable functionality.

The latch circuit 420 includes a feedback circuit 422 that has an inverter 424 and an NAND gate 426. When the reset signal 410 switches to HIGH, the CPBAR signal switches to HIGH, the TCP signal switches to LOW, the TCPB signal switches to HIGH, the DCP signal switches to LOW, and the DCPB signal switches to HIGH. This causes the tri-state inverters 216 and 218 to enter a high impedance state, inhibiting the test data 106 and the normal data 110 from influencing the QBI node.

The reset bar signal 428 is provided to one of the inputs of the NAND gate 426. When the reset signal 410 is HIGH and the reset bar signal 428 is LOW, the feedback circuit 422 switches the QBI node 222 to HIGH and maintains the QBI node 222 at the HIGH level. The output Q is switched to LOW and maintained at the LOW level, regardless of the level of the normal data and test data input signals.

Figure 10:
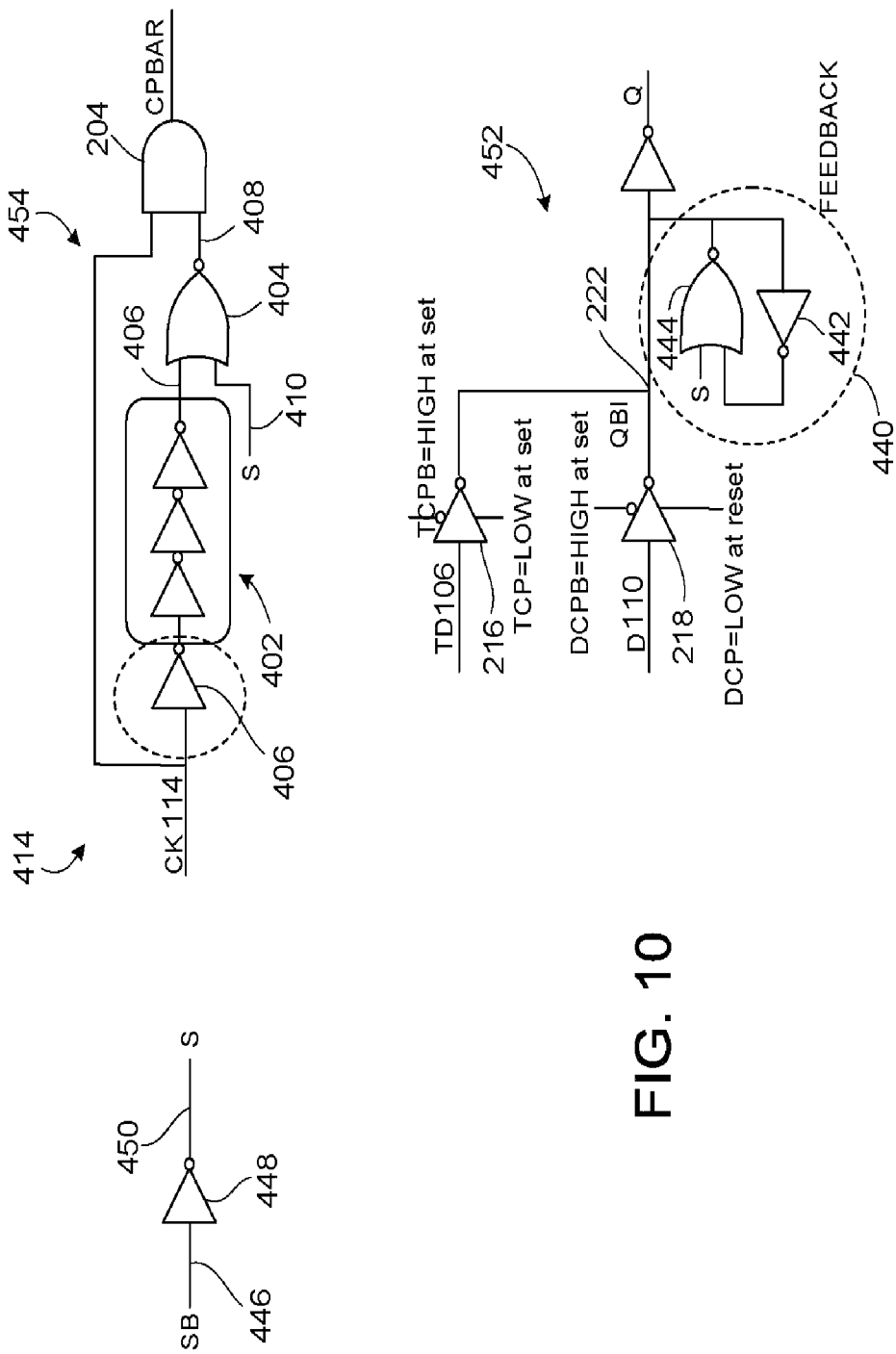
FIGS. 10 and 11 are circuit diagrams of example pulse latches having set functionality.

Referring to FIG. 10, in some examples, a pulse latch 414 having asynchronous set functionality includes a pulse generator 454 and a latch circuit 452. The latch circuit 452 can be implemented by replacing the feedback circuit 422 in FIG. 9 with a feedback circuit 440 that includes an inverter 442 and a NOR gate 444. The pulse generator 454 can be similar to the pulse generator 400 of FIG. 9, except that the reset signal 410 is replaced with a set signal 450. A set bar (SB) signal 446 is provided to an inverter 448 to generate the set (S) signal 450.

When the set signal 450 switches to HIGH, the output signal 408 of the NOR gate 404 switches to LOW, the CPBAR signal switches to HIGH, the TCP signal switches to LOW, the TCPB signal switches to HIGH, the DCP signal switches to LOW, and the DCPB signal switches to HIGH. This causes the tri-state inverters 216 and 218 to switch to a high impedance state, inhibiting the test data 106 and the normal data 110 from influencing the QBI node 222.

The set signal 450 is provided to one of the inputs of the NOR gate 444. When the set signal 450 is HIGH and the set bar signal 446 is LOW, the feedback circuit 440 switches the QBI node 222 to LOW and maintains the QBI node 222 at the LOW level. The output Q is switched to HIGH and maintained at the HIGH level, regardless of the level of the normal data and test data input signals.

In some implementations, the pulse latch 100 can have synchronous set functionality by asynchronously inhibiting the pulse generator 102 and synchronously setting the feedback circuit.

Figure 11:
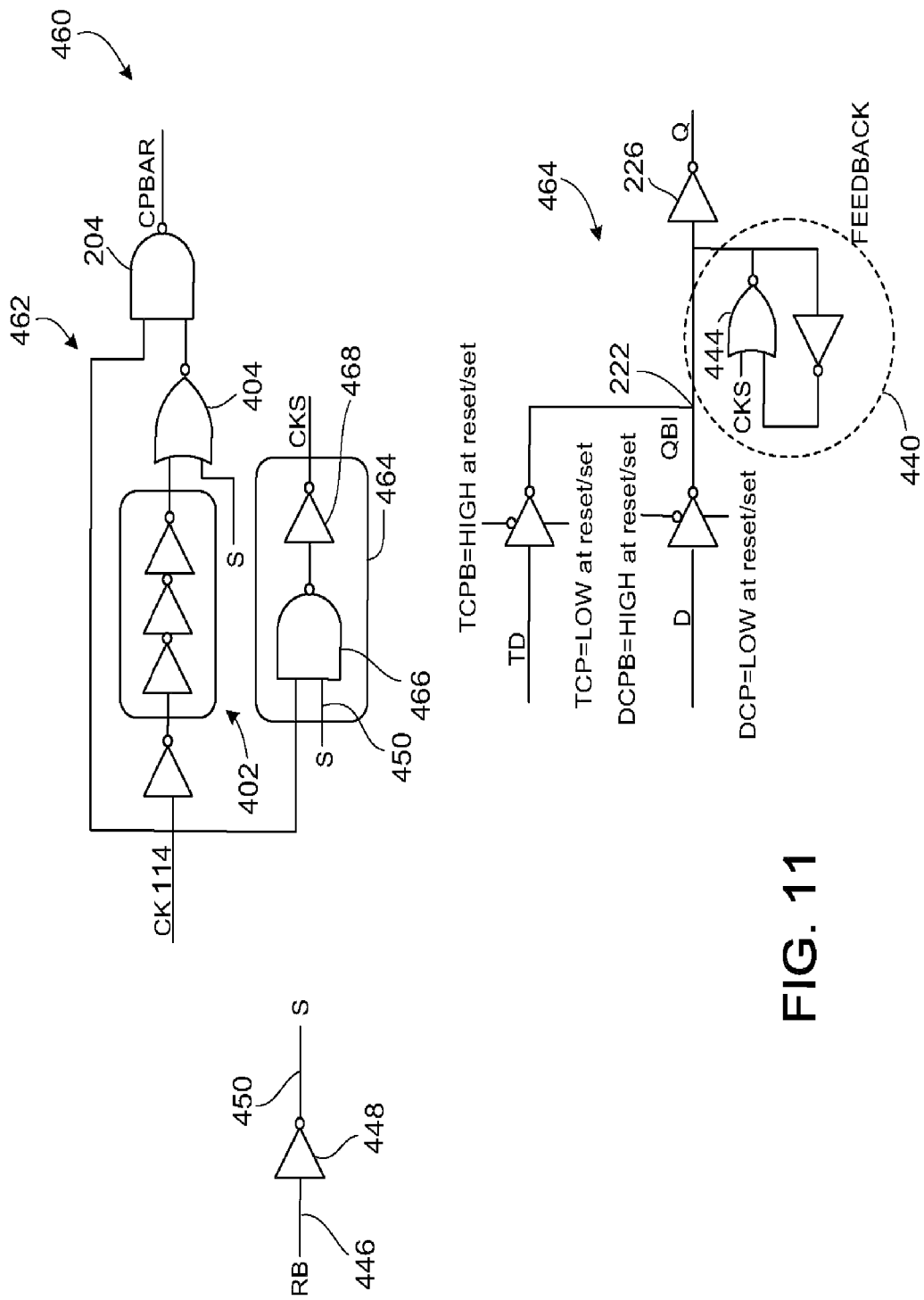

Referring to FIG. 11, in some examples, a pulse latch 460 having synchronous set functionality includes a pulse generator 462 and a latch circuit 464. The pulse generator 462 includes a delay circuit 402, a NOR gate 404, and an NAND gate 204, similar to those in the example of FIG. 9. The pulse generator 462 has a circuit 464 that includes an NAND gate 466 and an inverter 468. A set bar signal 446 is sent to an inverter 448 to generate a set signal 450. The NAND gate 466 receives the clock signal 114 and the set signal 450 as input. The output of the NAND gate 466 is sent to the inverter 468, which generates an output clocked set (CKS) signal.

When the set signal 450 switches to HIGH, after a subsequent rising edge of the clock signal 114, the CKS signal switches to HIGH. The CKS signal is provided to an input of a NOR gate 444 of a feedback circuit 440 of the latch circuit 464. The HIGH level CKS signal causes the QBI node 222 to switch to LOW and the output Q to switch to HIGH. The set function is synchronized with the rising edge of the clock signal 114.

Figure 12:
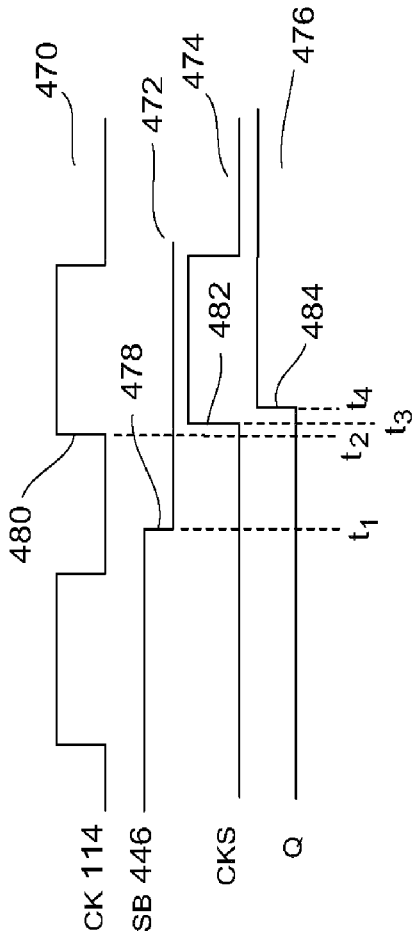
FIG. 12 shows timing diagrams.

FIG. 12 shows timing diagrams 470, 472, 474, and 476 of the clock signal 114, the set bar signal 446, the CKS signal, and the output Q signal in FIG. 11. For example, at time t1, the set bar signal 446 switches from HIGH to LOW (478). After the subsequent rising edge 480 of the clock signal 114, which occurs at time t2, the CKS signal switches to HIGH (482) at time t3 shortly after time t2, and the output Q signal switches to HIGH (484) at time t4 shortly after time t3. The delay from t2 to t3 is due to signal propagation delay caused by the NAND gate 466 and the inverter 468. The delay from t3 to t4 is due to signal propagation delay caused by the NOR gate 444 and the inverter 226.

Figure 13:
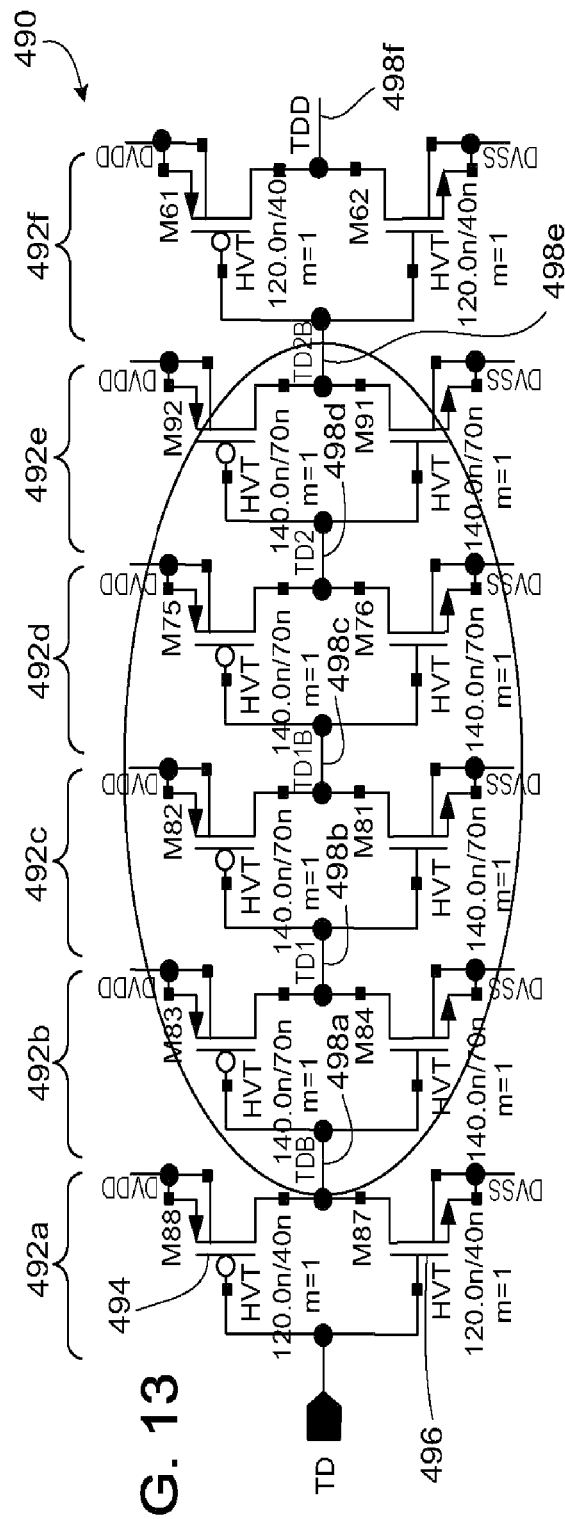
FIG. 13 is a circuit diagram of an example delay buffer.

Referring to FIG. 13, in some implementations, a delay buffer 490 may be added to the test data input to reduce the test data hold time requirement, e.g., to zero. For example, the delay buffer 490 includes an even number of inverters, e.g., 492a to 492f, connected one after another. The output node of the first inverter 492a is connected to the input node of the second inverter 492b, and the output node of the second inverter 492b is connected to the input node of the third inverter 492c, and so forth. Each inverter includes a PMOS transistor 494 and an NMOS transistor 496. Because the test data rise hold time requirement is sometimes more difficult to meet than the test data fall hold time requirement, the delay buffer 490 is designed to delay the rising edge of the test data more significantly than the falling edge.

This is achieved by an asymmetric configuration in which each of the inverters 492a to 492f has a stronger transistor and a weaker transistor. The inverters 492a to 492f alternate in the strong/weak transistors such that each of the first inverter 492a, third inverter 492c, and fifth inverter 492e has a stronger PMOS transistor 494 and a weaker NMOS transistor 496. Each of the second inverter 492b, fourth inverter 492d, and sixth inverter 492f has a stronger NMOS transistor 496 and a weaker PMOS transistor 494. In this example, all of the PMOS and NMOS transistors have the same channel length. The stronger transistors have wider channels and larger sizes than the weaker transistors. The larger sizes result in larger parasitic capacitances.

The test data signal is sent to the input of the first inverter 492a. When the test data switches from LOW to HIGH, the output of the first inverter 492a switches to LOW. The NMOS transistor 496 in the first inverter 492a pulls the voltage level of an output node 498a to LOW. The PMOS transistor 494 in the first inverter 492a does not assist in pulling down the voltage level of the node 498a to the LOW level, so the effect of a larger PMOS transistor having a larger capacitance is to slow the pulling down of the voltage level at the node 498a.

When the input of the second inverter 492b is switched to LOW, the PMOS transistor 494 of the second inverter 492b pulls the voltage level of an output node 498b to HIGH. The NMOS transistor 496 in the second inverter 492b does not assist in pulling up the voltage level of the node 498b to the HIGH level, so the effect of a larger NMOS transistor having a larger capacitance is to slow the pulling up of the voltage level of the node 498b.

Similarly, the PMOS transistors in the third and fifth inverters 492c and 492e do not assist in pulling down the voltage levels at the nodes 498c and 498e to the LOW level, so the effect of larger PMOS transistors having larger capacitances is to slow the pulling down of the voltage levels of the nodes 498c and 498e. The NMOS transistors in the fourth and sixth inverters 492d and 492f do not assist in pulling up the voltage levels of the nodes 498d and 498f to the LOW level, so the effect of larger NMOS transistors having larger capacitances is to slow the pulling up of the voltage levels of the nodes 498d and 498f. For a given number of inverters in a delay buffer, alternately increasing the sizes of the PMOS and NMOS transistors can increase the amount of delay provided by the delay buffer.

When the channel widths of the PMOS transistors of the first, third, and fifth inverters, and the NMOS transistors of the second, fourth, and sixth inverters are increased, the driving power associated with the falling edge of the test data is increased. Thus, the test data fall time may be shortened.

In some implementations, the channel length of the transistors in the delay buffer 490 is the same as that of the transistors in the delay circuit 234 in the pulse latch 102. When designing the pulse latch 100, the pulse width (e.g., DCPPWH and TCPPWH) should be large enough to allow the QBI node to change, but a large pulse width means a larger hold time. The test data hold time can be reduced (e.g., to 0) by adding a delay buffer on the test data input. The channel length of the transistors in the test data buffer 490 can be selected to be similar to, or the same as, the channel lengths of the long channel delay elements 200a to 200e in the delay circuit 234 to provide tracking between delay chains in order to keep the test data hold time small (e.g., near or equal to 0) over a range of process, voltage, and temperature levels.

Figure 14:
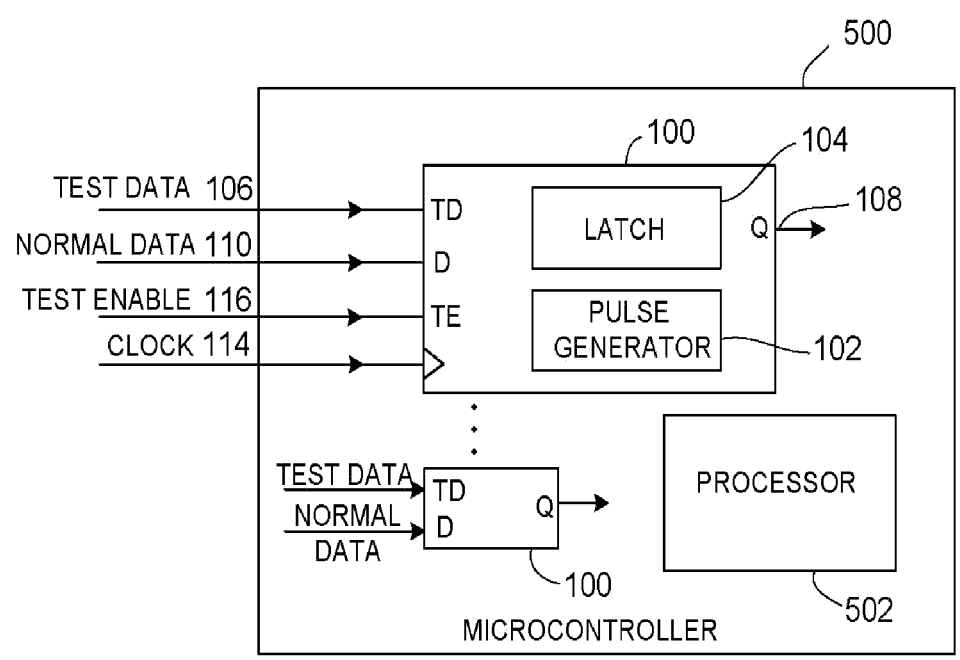
FIG. 14 is a block diagram of an example microcontroller having at least one pulse latch.

Referring to FIG. 14, a microcontroller 500 includes a data processor 502 and several pulse latches 100. Each pulse latch 100 includes a pulse generator 102 and a latch circuit 104. The microcontroller 500 can operate in a test mode in which the pulse latches 100 latch test data 106 for use in testing the operations of the microcontroller 500. The microcontroller 500 can also operate in a normal mode in which the pulse latches 100 latch normal data 110 that can be processed by the data processor 502. The pulse generator 102 generates pulse signals that control tri-state elements in the latch circuit 104 for selecting between the normal data 110 and the test data 106. In some examples, the pulse latches 100 are registers, and the latched data are configuration data used to control the operations of the data processor 502. The pulse latch 100 in FIG. 14 can be similar to or the same as the pulse latch 100 in FIG. 1.

The pulse latches 100 receive a test enable signal 116, which is asserted (e.g., at logic HIGH) when the microcontroller 500 operates in the test mode, and de-asserted (e.g., at logic LOW) when the microcontroller 500 operates in the normal mode. Depending on whether the microcontroller 500 is operating in the test or normal mode, the pulse latches 100 latch the test data 106 or the normal data 110 and provides the latched data output Q 108 for use by other circuits in the microcontroller 500.

In some implementations, the microcontroller 500 can operate at different data rates for the test mode and the normal mode. For example, the microcontroller 500 can operate at a higher data rate when in the normal mode, and operate at a lower data rate when in the test mode. The pulse generator 102 can generate pulse signals with different pulse widths for driving tri-state inverters depending on whether in the test mode or the normal mode. For example, the pulses can have shorter widths when in the test mode, and have longer widths when in the normal mode.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

In the pulse generator shown in FIGS. 9 to 11, the NOR gate 404 can be located in front of the delay circuit 402 to prevent the pulse from propagating through the delay circuit 402. The allows more power to be saved because the delay elements 406 does not have to switch between LOW and HIGH levels. There may be a longer reset latency because the set or reset signal has to propagate through the delay circuit 402. In the example of FIG. 13, the test data hold time refers to the length of time that the test data needs to be ready prior to the clock transition. In some examples, the test data hold time may be a negative number, meaning that the test data can be provided to the input of the latch circuit 104 after the clock transition. Because there is an inherent delay from the clock edge to the generation of the DCP and TCP pulse signals, the data can be input after the clock has transitioned, and the test data can still be latched properly.

In the examples shown in FIGS. 1, 2, 9-11, and 14, the pulse latches receive normal data and test data. In some examples, the pulse latch can have two inputs that can receive any type of data signals. The pulse latch can operate in two modes, in which during a first mode the pulse latch latches data at a first input, and during a second mode the pulse latch latches data at a second input. There is no limit as to the type of data that can be received at the first and second inputs.

The pulse latch can have more than two inputs. For example, the pulse latch can have three input nodes, each having an associated tri-state element. The pulse generator can generate a more complicated set of pulse signals in order to control the tri-state elements. When the pulse latch is operating in a first mode, the data at a first input is latched, when operating in a second mode, the data at a second input is latched, and when operating in a third mode, the data at a third input is latched. The D-to-Q delay remains low because the number of logic gates in the path between input to output remains low. The tri-state element can be, e.g., a tri-state inverter (as shown in FIG. 2) or an inverter followed by a transmission gate.

The pulse latches can be modified such that the pulse signals DCP, DCPB, TCP, and TCPB are triggered by falling edges of the clock signal. In some examples, the HIGH and LOW signal levels described in the examples above may be reversed. For example, the pulse generator may generate pulse signals used to control the tri-state elements to latch the test data when the test enable signal is LOW.

As discussed above, when designing the pulse latch, it is useful to select the device parameters such that the pulse width (DCPPWH or DCPBPWL) of the latch enable signal tracks a latch delay over a range of process, voltage, and temperature. The variance of the pulse width to latch delay ratio may be different depending on circuit design and process technology. In some examples, the channel length of transistors in the pulse latch 100 can be selected such that the pulse width to latch delay ratio does not change by more than 20% (i.e., within −20% to +20%) over a predetermined temperature range, such as from −40° C. to 125° C., using the value at room temperature (e.g., 20° C.) as reference. In some examples, the pulse latch 100 is designed such that the pulse width to latch delay ratio does not change by more than 10% (i.e., within −10% to +10%) from −40° C. to 125° C., using the value at 20° C. as reference. In some examples, the pulse latch 100 is designed such that the pulse width to latch delay ratio does not change by more than 50% (i.e., within −50% to +50%) from −40° C. to 125° C., using the value at 20° C. as reference. In some examples, the pulse latch 100 can be designed such that the pulse width to latch delay ratio does not vary by more than 20% over a predetermined process range (e.g., the channel length is within a predetermined range), or a predetermined power supply voltage range. Other variance ranges can also be used.

Accordingly, other implementations are within the scope of the following claims.

What is claimed is:

1. An apparatus comprising:
a pulse generator to generate a first pulse signal and a second pulse signal based on a clock signal and a test enable signal, the pulse generator generating the first pulse signal when the test enable signal is in a first state, the pulse generator generating the second pulse signal when the test enable signal is in a second state, the pulse generator comprising a delay circuit having delay components connected in series, comprising a first delay component and a second delay component, wherein each of the first and second delay components comprises a transistor of a first type and a transistor of a second type, the first type of transistor of the first delay component has a channel width that is larger than the channel width of the first type of transistor of the second delay component, and the second type of transistor of the second delay component has a channel width that is larger than the channel width of the second type of transistor of the first delay component; and
a latch circuit that selectively latches one of a normal data input signal and a test data input signal, and outputs the latched signal, the latch circuit comprising a first tri-state element and a second tri-state element, the first tri-state element being controlled by the first pulse signal to enable the test data input signal to be latched when the test enable signal is in the first state, the second tri-state element being controlled by the second pulse signal to enable the normal data input signal to be latched when the test enable signal is in the second state;
wherein the pulse generator is configured to generate the first and second pulse signals such that the first pulse signal has a pulse width that is different from a pulse width of the second pulse signal.

2. The apparatus of claim 1 in which a data path from an input node of the data latch that receives the normal data input signal to an output node that provides the latched signal has no more than two levels of logic gates.

3. The apparatus of claim 1 in which each of the first and second pulse signals has the pulse width that is less than one-half of a clock period.

4. The apparatus of claim 1 in which each delay component comprises an inverter, the first type of transistor comprises a PMOS transistor, and the second type of transistor comprises an NMOS transistor.

5. The apparatus of claim 3 in which the pulse generator and the data latch are configured such that a ratio between the pulse width of the second pulse signal and a data-to-output (D-to-Q) delay is within a specified range when a power supply voltage is within a predetermined rage.

6. The apparatus of claim 3 in which the pulse generator and the data latch are configured such that a ratio between the pulse width of the second pulse signal and a data-to-output (D-to-Q) delay is within a specified range when an operating temperature is within a predetermined range.

7. The apparatus of claim 3 in which the pulse generator and the data latch are configured such that a ratio between the pulse width of the second pulse signal and a data-to-output (D-to-Q) delay is within a specified range when a minimum dimension of a semiconductor process used to fabricate the pulse generator and the data latch is within a predetermined range.

8. The apparatus of claim 1, comprising a logic circuit to allow an asynchronous set or reset control signal to asynchronously set or reset, respectively, the latched signal.

9. The apparatus of claim 1, comprising logic gates to allow synchronous set or reset control signals to synchronously set or reset, respectively, the latched signal.

10. The apparatus of claim 1, comprising a feedback circuit connected to the output of the latch circuit, the feedback circuit maintaining a state of the latched signal until the output of one of the tri-state elements changes state.

11. The apparatus of claim 1, comprising a delay circuit that receives the test input signal and generates a delayed test input signal that is sent to the latch circuit, in which the delay circuit reduces a hold time for the test input signal.

12. The apparatus of claim 1 in which at least one of the first and second tri-state elements comprises a tri-state inverter.

13. The apparatus of claim 1, comprising a data processor that processes the latched signal.

14. The apparatus of claim 1, comprising control circuitry that is configured according to the latched signal.

15. The apparatus of claim 1 in which the latch circuit comprises a second output to provide an inverted version of the latched signal.

16. The apparatus of claim 1 in which the pulse generator is triggered by a positive edge of the clock signal to generate the first and second pulse signals.

17. The apparatus of claim 1 in which the first pulse signal and the second pulse signal are not generated in the same clock cycle.

18. An apparatus comprising:
a pulse generator to generate a first pulse signal and a second pulse signal based on a clock signal and a test enable signal, the pulse generator generating the first pulse signal when the test enable signal is in a first state, the pulse generator generating the second pulse signal when the test enable signal is in a second state, the pulse generator comprising a delay circuit having series connected inverters, some of the inverters having PMOS transistors having stronger driving capabilities than corresponding NMOS transistors, and some of the inverters having NMOS transistors having stronger driving capabilities than corresponding PMOS transistors; and a latch circuit that selectively latches one of a normal data input signal and a test data input signal, and outputs the latched signal, the latch circuit comprising a first tri-state element and a second tri-state element, the first tri-state element being controlled by the first pulse signal to enable the test data input signal to be latched when the test enable signal is in the first state, the second tri-state element being controlled by the second pulse signal to enable the normal data input signal to be latched when the test enable signal is in the second state;

wherein the pulse generator is configured to generate the first and second pulse signals such that the first pulse signal has a pulse width that is different from a pulse width of the second pulse signal.

19. An apparatus comprising:

a pulse generator to generate a first pulse signal and a second pulse signal based on a clock signal and a test enable signal, the pulse generator generating the first pulse signal when the test enable signal is in a first state, the pulse generator generating the second pulse signal when the test enable signal is in a second state, the pulse generator comprising a delay circuit having series connected inverters, some of the inverters have PMOS transistors having larger capacitances than corresponding NMOS transistors, and some of the inverters have NMOS transistors having larger capacitances than corresponding PMOS transistors; and a latch circuit that selectively latches one of a normal data input signal and a test data input signal, and outputs the latched signal, the latch circuit comprising a first tri-state element and a second tri-state element, the first tri-state element being controlled by the first pulse signal to enable the test data input signal to be latched when the test enable signal is in the first state, the second tri-state element being controlled by the second pulse signal to enable the normal data input signal to be latched when the test enable signal is in the second state;

wherein the pulse generator is configured to generate the first and second pulse signals such that the first pulse signal has a pulse width that is different from a pulse width of the second pulse signal.

20. An apparatus comprising:

a pulse generator to generate a first pulse signal and a second pulse signal based on a clock signal and an enable signal, wherein the pulse generator comprises a delay circuit having first inverter and a second inverter connected in series, the first inverter having a PMOS transistor having a channel width that is larger than the channel width of a PMOS transistor of the second inverter, the second inverter having an NMOS transistor having a channel width that is larger than the channel width of an NMOS transistor of the first inverter; and a latch circuit that selectively latches one of a first input signal and a second input signal, and outputs the latched signal, the latch circuit comprising a first tri-state element and a second tri-state element, the first tri-state element being controlled by the first pulse signal to enable the first input signal to be latched when the enable signal is at a first state, the second tri-state element being controlled by the second pulse signal to enable the second input signal to be latched when the enable signal is at a second state;

wherein the pulse generator is configured to generate the first and second pulse signals such that the first pulse signal has a first pulse width that is different from a pulse width of the second pulse signal.

21. The apparatus of claim 20 in which a data path from an input node of the data latch that receives the first input data to an output node that provides the output latched data has no more than two levels of logic gates.

22. The apparatus of claim 20 in which the pulse generator comprises a strong device for driving the first pulse signal and a weak device for driving the second pulse signal.

23. The apparatus of claim 20, comprising a logic circuit to allow an asynchronous set or reset control signal to asynchronously set or reset, respectively, the latched signal.

24. The apparatus of claim 20, comprising logic gates to allow synchronous set or reset control signals to synchronously set or reset, respectively, the latched signal.

25. The apparatus of claim 20, comprising a feedback circuit connected to the output of the data latch, the feedback circuit maintaining a state of the latched signal until the output of one of the tri-state elements changes state.

26. The apparatus of claim 20 in which the first input signal comprise a test input signal and the second input signal comprise a data input signal.

27. The apparatus of claim 20, comprising a data processor that processes the latched signal.

28. The apparatus of claim 20, comprising control circuitry that is configured according to the latched signal.

29. An apparatus comprising:

a pulse generator to generate a first pulse signal and a second pulse signal based on a clock signal and an enable signal, wherein the pulse generator comprises a delay circuit having series connected inverters, some of the inverters have PMOS transistors having stronger driving capabilities than corresponding NMOS transistors, and some of the inverters have NMOS transistors having stronger driving capabilities than corresponding PMOS transistors; and a latch circuit that selectively latches one of a first input signal and a second input signal, and outputs the latched signal, the latch circuit comprising a first tri-state element and a second tri-state element, the first tri-state element being controlled by the first pulse signal to enable the first input signal to be latched when the enable signal is at a first state, the second tri-state element being controlled by the second pulse signal to enable the second input signal to be latched when the enable signal is at a second state;

wherein the pulse generator is configured to generate the first and second pulse signals such that the first pulse signal has a first pulse width that is different from a pulse width of the second pulse signal.

30. An apparatus comprising:

a pulse generator to generate a first pulse signal and a second pulse signal based on a clock signal and an enable signal, wherein the pulse generator comprises a delay circuit having series connected inverters, some of the inverters have PMOS transistors having larger capacitances than corresponding NMOS transistors, and some of the inverters have NMOS transistors having larger capacitances than corresponding PMOS transistors; and a latch circuit that selectively latches one of a first input signal and a second input signal, and outputs the latched signal, the latch circuit comprising a first tri-state element and a second tri-state element, the first tri-state element being controlled by the first pulse signal to enable the first input signal to be latched when the enable signal is at a first state, the second tri-state element being controlled by the second pulse signal to enable the second input signal to be latched when the enable signal is at a second state;

wherein the pulse generator is configured to generate the first and second pulse signals such that the first pulse signal has a first pulse width that is different from a pulse width of the second pulse signal.

\* \* \* \* \*